United States Patent
Yamada

(10) Patent No.: US 11,668,555 B2
(45) Date of Patent: Jun. 6, 2023

(54) LASER INTERFEROMETER

(71) Applicant: Seiko Epson Corporation, Tokyo (JP)

(72) Inventor: Kohei Yamada, Shiojiri (JP)

(73) Assignee: SEIKO EPSON CORPORATION

(*) Notice: Subject to any disclaimer, the term of this patent is extended or adjusted under 35 U.S.C. 154(b) by 0 days.

(21) Appl. No.: 17/411,281

(22) Filed: Aug. 25, 2021

(65) Prior Publication Data

US 2022/0065612 A1    Mar. 3, 2022

(30) Foreign Application Priority Data

Aug. 26, 2020 (JP) .................................. 2020-142498

(51) Int. Cl.
| | | |
|---|---|---|
| G01B 9/02001 | (2022.01) | |
| H01S 5/00 | (2006.01) | |
| G01P 3/36 | (2006.01) | |
| G02F 2/00 | (2006.01) | |
| G02F 1/11 | (2006.01) | |

(52) U.S. Cl.
CPC .......... *G01B 9/0201* (2013.01); *G01P 3/363* (2013.01); *G02F 1/11* (2013.01); *G02F 2/00* (2013.01); *H01S 5/0085* (2013.01)

(58) Field of Classification Search
CPC .............. G01B 9/0201; G01B 9/02045; G01B 9/02083; G01P 3/363; G01P 3/366; G02F 1/11; G02F 2/00; H01S 5/0085
See application file for complete search history.

(56) References Cited

U.S. PATENT DOCUMENTS

| | | | | |
|---|---|---|---|---|
| 4,289,403 | A * | 9/1981 | Allington ............... | G01N 21/45 359/279 |
| 5,925,968 | A * | 7/1999 | Yachi .................... | H03H 9/0509 310/366 |
| 6,381,015 | B1 * | 4/2002 | Sonehara ............... | G01N 21/45 356/497 |
| 2020/0309953 | A1 | 10/2020 | Yamada | |
| 2022/0065614 | A1 * | 3/2022 | Yamada ............. | G01B 9/02083 |
| 2022/0065892 | A1 * | 3/2022 | Yamada .................... | G02F 2/00 |

FOREIGN PATENT DOCUMENTS

| | | |
|---|---|---|
| JP | H02-038889 A | 2/1990 |
| JP | H09-054293 A | 2/1997 |
| JP | 2007-285898 A | 11/2007 |
| JP | 2012-060259 A | 3/2012 |
| JP | 2020-165700 A | 10/2020 |

* cited by examiner

*Primary Examiner* — Jonathan M Hansen
(74) *Attorney, Agent, or Firm* — Harness, Dickey & Pierce, P.L.C.

(57) ABSTRACT

A laser interferometer includes a light source that emits first laser light, an optical modulator that includes a vibrator and modulates the first laser light by using the vibrator to generate second laser light including a modulated signal, a photodetector that receives interference light between third laser light including a sample signal generated by reflecting the first laser light on an object and the second laser light to output a light reception signal, a demodulation circuit that demodulates the sample signal from the light reception signal based on a reference signal, and a signal generator that outputs the reference signal input to the demodulation circuit and outputs a drive signal input to the optical modulator, in which Vd/Vr<10, where Vr is a voltage of the reference signal and Vd is a voltage of the drive signal.

19 Claims, 10 Drawing Sheets

LASER INTERFEROMETER

The present application is based on, and claims priority from JP Application Serial Number 2020-142498, filed Aug. 26, 2020, the disclosure of which is hereby incorporated by reference herein in its entirety.

BACKGROUND

1. Technical Field

The present disclosure relates to a laser interferometer.

2. Related Art

JP-A-9-54293 discloses a laser Doppler velocimeter that irradiates a vibrating object with a laser beam and measures the velocity of the object by using a frequency of the laser beam changed by the Doppler effect. In order to detect the directionality of the vibration phenomenon of the object, the laser Doppler velocimeter requires a structure for modulating light emitted from a laser light source. Therefore, JP-A-9-54293 discloses that an acousto-optic modulator or an electro-optical modulator is used.

A radio frequency (RF) signal output from an oscillation circuit is input to the acousto-optic modulator or the electro-optical modulator described in JP-A-9-54293. As a result, the refractive indexes of the optical elements in the modulator are changed to modulate light.

However, as the signal input to the modulators, a signal obtained by further amplifying the RF signal from the oscillation circuit is used. Therefore, an amplifier having a large amplification factor is required to be inserted between the oscillation circuit and the modulator. For this reason, it may be difficult to miniaturize the laser Doppler velocimeter described in JP-A-9-54293.

SUMMARY

A laser interferometer according to an application example of the present disclosure includes: a light source that emits first laser light; an optical modulator that includes a vibrator and modulates the first laser light by using the vibrator to generate second laser light including a modulated signal; a photodetector that receives interference light between third laser light including a sample signal generated by reflecting the first laser light on an object and the second laser light to output a light reception signal; a demodulation circuit that demodulates the sample signal from the light reception signal based on a reference signal; and a signal generator that outputs the reference signal input to the demodulation circuit and outputs a drive signal input to the optical modulator, in which Vd/Vr<10, where Vr is a voltage of the reference signal and Vd is a voltage of the drive signal.

DESCRIPTION OF EXEMPLARY EMBODIMENTS

Hereinafter, a laser interferometer according to the present disclosure will be described in detail based on the embodiments shown in the accompanying drawings.

Figure 1:
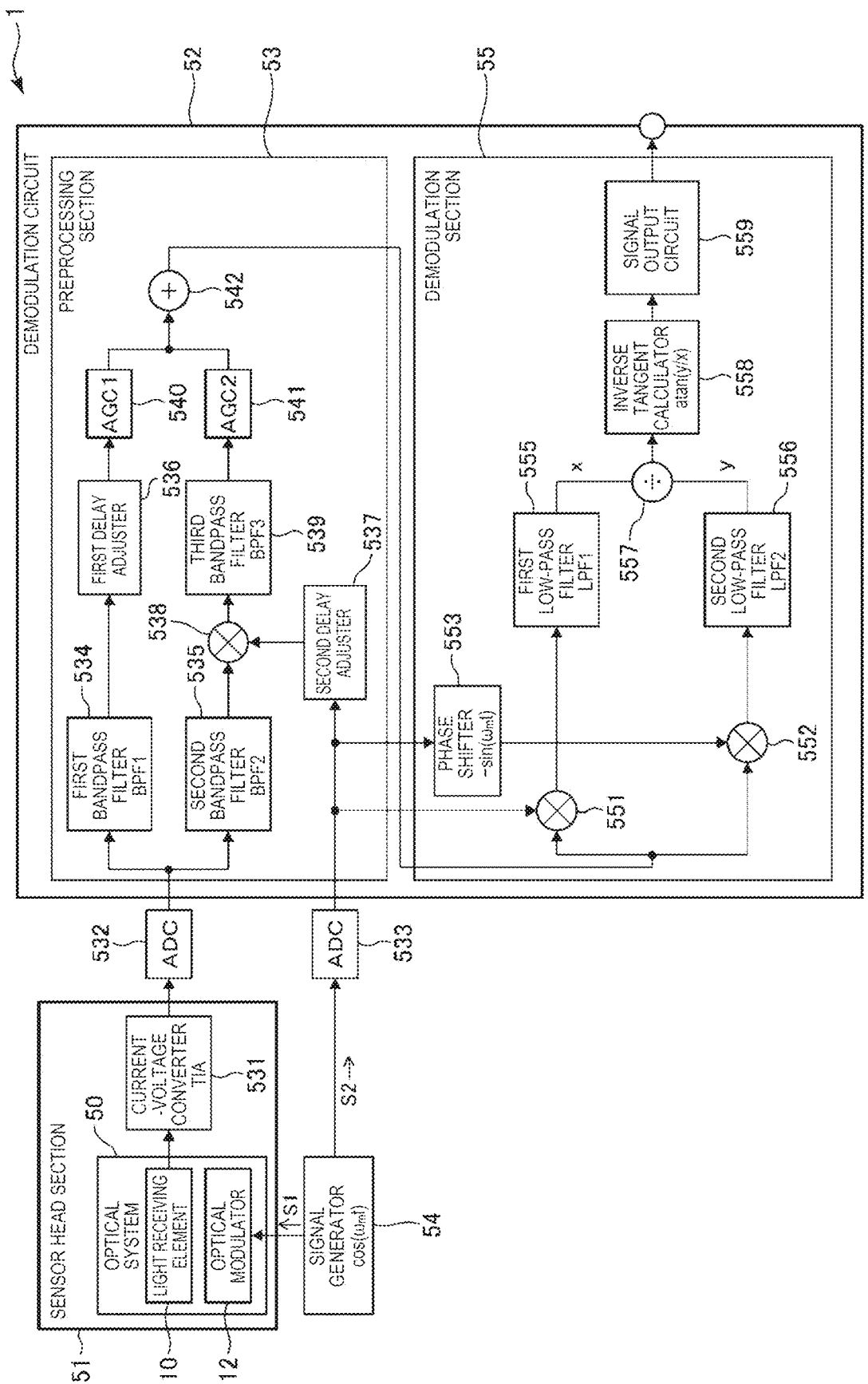
FIG. 1 is a functional block diagram showing a laser interferometer according to an embodiment.

FIG. 1 is a functional block diagram showing a laser interferometer according to an embodiment.

A laser interferometer 1 shown in FIG. 1 has a sensor head section 51 including an optical system 50, a demodulation circuit 52 to which a signal from the optical system 50 is input, and a signal generator 54 that outputs a signal to the optical system 50 and the demodulation circuit 52.

1. Sensor Head Section

Figure 2:
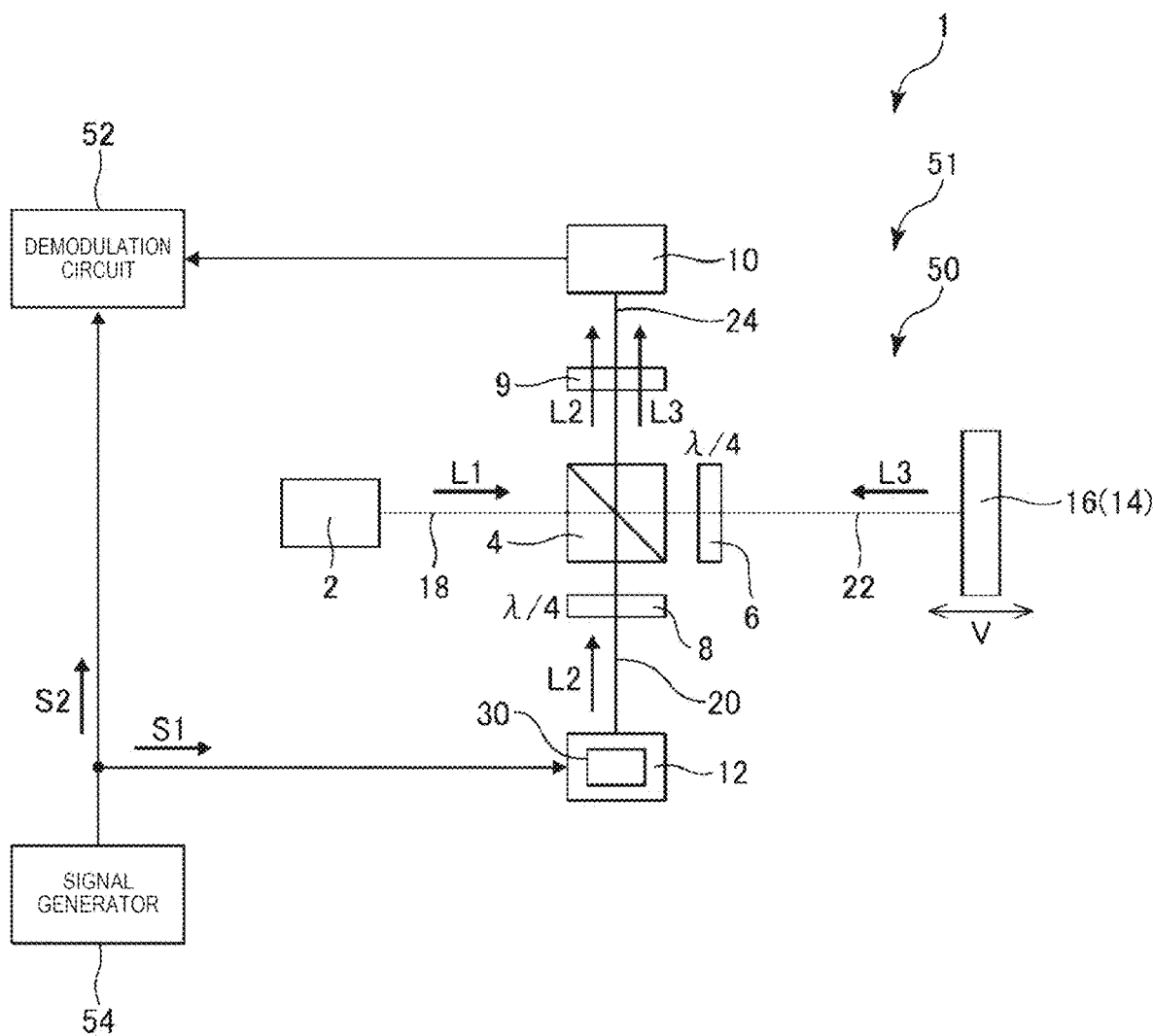
FIG. 2 is a schematic configuration diagram showing a sensor head section and an optical system shown in FIG. 1.

FIG. 2 is a schematic configuration diagram showing the sensor head section 51 and the optical system 50 shown in FIG. 1.

The optical system 50 includes a light source 2, a polarization beam splitter 4, a quarter wave plate 6, a quarter wave plate 8, an optical analyzer 9, a photodetector 10, a frequency shifter type optical modulator 12, and a set section 16 in which an object 14 to be measured is arranged.

The light source 2 emits emission light L1 (first laser light) having a predetermined wavelength. The photodetector 10 converts the received light into an electric signal. The optical modulator 12 includes a vibrator 30 and modulates the emission light L1 to generate reference light L2 (second laser light) including a modulated signal. The set section 16 may be provided as needed, and the object 14 to be measured can be arranged therein. The emission light L1 incident on the object 14 to be measured is reflected as object light L3 (third laser light) including a sample signal derived from the object 14 to be measured.

The optical path of the emission light L1 emitted from the light source 2 is referred to as an optical path 18. The optical path 18 is coupled to the optical path 20 by the reflection of the polarization beam splitter 4. On the optical path 20, the quarter wave plate 8 and the optical modulator are arranged in this order from the polarization beam splitter 4 side. Further, the optical path 18 is coupled to an optical path 22 by the transmission of the polarization beam splitter 4. On the optical path 22, the quarter wave plate 6 and the set section 16 are arranged in this order from the polarization beam splitter 4 side.

The optical path 20 is coupled to an optical path 24 by the transmission of the polarization beam splitter 4. On the optical path 24, the optical analyzer 9 and the photodetector 10 are arranged in this order from the polarization beam splitter 4 side.

The emission light L1 emitted from the light source 2 enters the optical modulator 12 via the optical path 18 and the optical path 20. Further, the emission light L1 enters the object 14 to be measured via the optical path 18 and the optical path 22. The reference light L2 generated by the optical modulator 12 enters the photodetector 10 via the optical path 20 and the optical path 24. The object light L3 generated by the reflection from the object 14 to be measured enters the photodetector 10 via the optical path 22 and the optical path 24.

Hereinafter, each section of the laser interferometer 1 will be described in sequence.

1.1. Light Source

The light source 2 is a laser light source that emits an emission light L1 with a narrow line width having coherence. When the line width is displayed by frequency difference, a laser light source having a line width of MHz band or less is preferably used. Specifically, gas lasers such as HeNe lasers, and semiconductor laser elements such as a distributed feedback-laser diode (DFB-LD), a laser diode with fiber bragg grating (FBG-LD), or a vertical cavity surface emitting laser (VCSEL) can be exemplified.

The light source 2 preferably includes a semiconductor laser element. This makes it possible to make the light source 2 particularly miniaturized. Therefore, the laser interferometer 1 can be made smaller. In particular, the sensor head section 51 in the laser interferometer 1, in which the optical system 50 is accommodated, can be made smaller and lighter, and thus it is also useful in that the operability of the laser interferometer 1 can be improved.

1.2. Polarization Beam Splitter

The polarization beam splitter 4 is an optical element that splits the incident light into transmitted light and reflected light. Further, the polarization beam splitter has a function of transmitting P-polarized light and reflecting S-polarized light, and can divide the polarization state of the incident light into orthogonal components. Hereinafter, a case where the emission light L1 which is linearly polarized light and has a ratio between the P-polarized light and the S-polarized light of, for example, 50:50 is incident on the polarization beam splitter 4 will be considered.

As described above, the polarization beam splitter 4 reflects the S-polarized light of the emission light L1 and transmits the P-polarized light.

The S-polarized light of the emission light L1 reflected by the polarization beam splitter 4 is converted into circularly polarized light at the quarter wave plate 8 and incident on the optical modulator 12. The circularly polarized light of the emission light L1 incident on the optical modulator 12 undergoes a frequency shift of $f_m$ [Hz] and is reflected as the reference light L2. Therefore, the reference light L2 includes a modulated signal having a modulation frequency of $f_m$ [Hz]. The reference light L2 is converted into the P-polarized light when the reference light L2 passes through the quarter wave plate 8 again. The P-polarized light of the reference light L2 passes through the polarization beam splitter 4 and the optical analyzer 9 and is incident on the photodetector 10.

The P-polarized light of the emission light L1 passing through the polarization beam splitter 4 is converted into circularly polarized light at the quarter wave plate 6 and incident on the object 14 to be measured in a moving state. The circularly polarized light of the emission light L1 incident on the object 14 to be measured undergoes a Doppler shift of $f_d$ [Hz] and is reflected as the object light L3. Therefore, the object light L3 includes a frequency signal having a frequency of $f_d$ [Hz]. The object light L3 is converted into the S-polarized light when the object light L3 passes through the quarter wave plate 6 again. The S-polarized light of the object light L3 is reflected by the polarization beam splitter 4, passes through the optical analyzer 9, and is incident on the photodetector 10.

As described above, since the emission light L1 has coherence, the reference light L2 and the object light L3 are incident on the photodetector 10 as interference light.

A non-polarization beam splitter may be used instead of the polarization beam splitter. In this case, since the quarter wave plate 6 and the quarter wave plate 8 are not required, the laser interferometer 1 can be made smaller by reducing the number of parts.

1.3. Optical Analyzer

Since the S-polarized light and the P-polarized light that are orthogonal to each other are independent of each other, interference does not appear by simply superimposing them. Therefore, a light wave obtained by superimposing the S-polarized light onto the P-polarized light is passed through the optical analyzer 9 tilted by 45° with respect to both S-polarized light and P-polarized light. By using the optical analyzer 9, light of the components common to each other can be transmitted to cause interference. As a result, in the optical analyzer 9, the modulated signal and the sample signal interfere with each other, and interference light having a frequency of $f_m-f_d$ [Hz] is generated.

1.4. Photodetector

The reference light L2 and the object light L3 are incident on the photodetector 10 via the polarization beam splitter 4 and the optical analyzer 9. Thereby, the reference light L2 and the object light L3 interfere with each other by optical heterodyne, and the interference light having a frequency of $f_m-f_d$ [Hz] is incident on the photodetector 10. By demodulating the sample signal from the interference light by the method to be described later, the movement of the object 14 to be measured, that is, the velocity and the vibration can be finally obtained. Examples of the photodetector 10 include a photodiode and the like.

1.5. Optical Modulator

Figure 3:
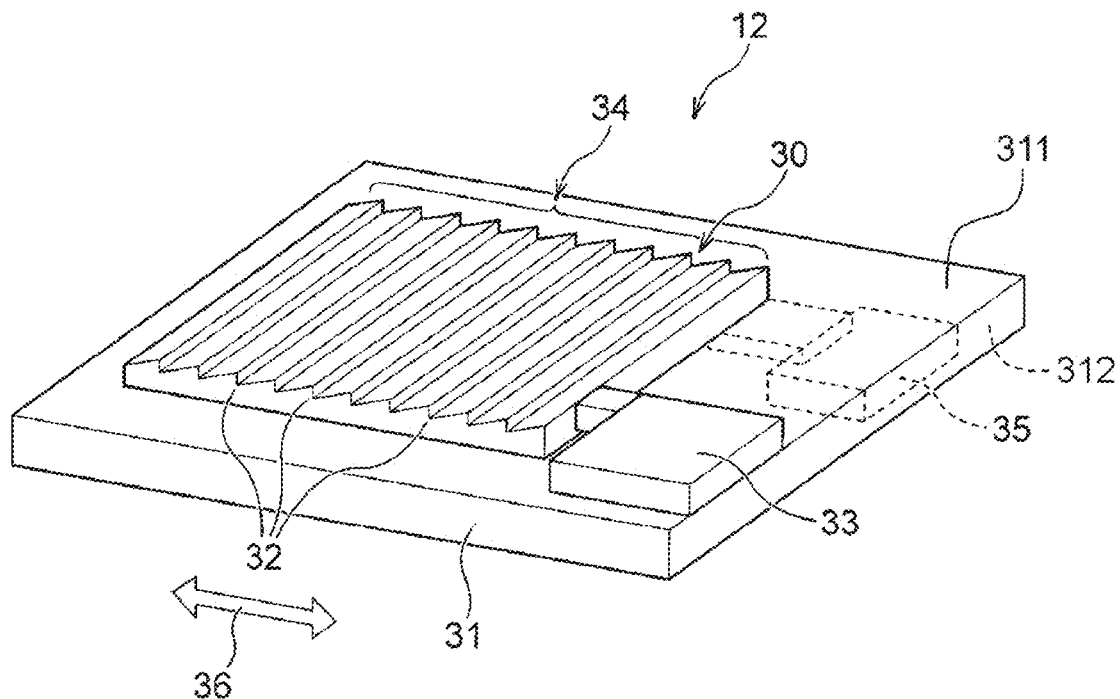
FIG. 3 is a perspective view showing a first configuration example of an optical modulator shown in FIG. 2.

FIG. 3 is a perspective view showing a first configuration example of the optical modulator 12 shown in FIG. 2.

1.5.1. Outline of Optical Modulator According to First Configuration Example The frequency shifter type optical modulator 12 includes a plate-shaped vibrator 30 and a substrate 31 that supports the vibrator 30.

The vibrator 30 is made of a material that repeats a mode of vibrating so as to be distorted in a direction along a surface by applying an electric potential. In the present embodiment, the vibrator 30 is a quartz crystal AT resonator that vibrates by thickness sliding along a vibration direction 36 in the high frequency region of the MHz band. A diffraction grating 34 is formed on the surface of the vibrator 30. The diffraction grating 34 has a structure in which a plurality of linear grooves 32 are arranged at regular intervals.

The substrate 31 has a front surface 311 and a back surface 312 having a front and back relationship with each other. The vibrator 30 is arranged on the front surface 311. Further, the front surface 311 is provided with a pad 33 for applying an electric potential to the vibrator 30. On the other hand, the back surface 312 is also provided with a pad 35 for applying an electric potential to the vibrator 30.

The size of the substrate 31 is, for example, about 0.5 mm or more and 10.0 mm or less on the long side. The thickness of the substrate 31 is, for example, about 0.1 mm or more and 2.0 mm or less. As an example, the substrate 31 has a shape of a square with a side of 1.6 mm and has a thickness of 0.35 mm.

The size of the vibrator 30 is, for example, about 0.2 mm or more and 3.0 mm or less on the long side. The thickness of the vibrator 30 is, for example, about 0.003 mm or more and 0.5 mm or less.

As an example, the vibrator 30 has a shape of a square with a side of 1.0 mm and has a thickness of 0.07 mm. In this case, the vibrator 30 oscillates at a basic oscillation frequency of 24 MHz. The oscillation frequency can be adjusted in the range of 1 MHz to 1 GHz by changing the thickness of the vibrator 30 and even considering overtones.

In FIG. 3, the diffraction grating 34 is formed on the entire surface of the vibrator 30, but it may be formed only on a part of the surface.

The intensity of the optical modulation by the optical modulator 12 is given by a dot product of a difference wave vector between a wave vector of the emission light L1 incident on the optical modulator 12 and a wave vector of the emission light L2 emitted from the optical modulator 12 and a vector of the vibrator 30 in the vibration direction 36. In the present embodiment, since the vibrator 30 vibrates by thickness sliding and this vibration is in-plane vibration, optical modulation cannot be performed even if light is incident perpendicularly to the surface of the vibrator 30 alone. Therefore, in the present embodiment, by providing the diffraction grating 34 in the vibrator 30, optical modulation can be performed by a principle to be described later.

The diffraction grating 34 shown in FIG. 3 is a blazed diffraction grating. The blazed diffraction grating is one in which the cross-sectional shape of the diffraction grating is stepped. The linear groove 32 of the diffraction grating 34 is provided such that its extending direction is orthogonal to the vibration direction 36.

When a drive signal S1 is supplied from the signal generator 54 shown in FIG. 1 to the vibrator 30 shown in FIG. 3 (an AC voltage is applied), the vibrator 30 oscillates. The electric power (driving power) required for the oscillation of the vibrator 30 is not particularly limited, but is as small as about 0.1 μW to 100 mW. Therefore, the drive signal S1 output from the signal generator 54 can be used for the vibrator 30 to oscillate without amplification. Therefore, in the present embodiment, since the amplifier having a large amplification factor becomes unnecessary, and the amplifier itself becomes unnecessary depending on the driving power, the size of the laser interferometer 1 can be reduced.

1.5.2. Method of Forming Diffraction Grating

The method of forming the diffraction grating 34 is not particularly limited, but as an example, a method may be provided in which the mold is formed by a method using a mechanical engraving type (ruling engine), and the groove 32 is formed on an electrode formed on the surface of the vibrator 30 of the quartz crystal AT resonator by the nanoimprint method. Here, the reason why the groove 32 is formed on the electrode is that in the case of the quartz crystal AT resonator, in principle, high-quality thickness sliding vibration can be generated on the electrode. The groove 32 is not limited to being formed on the electrode, but may be formed on the surface of the material of the non-electrode portion. Further, instead of the nanoimprint method, a processing method by exposure and etching, an electron beam drawing lithography method, a focused ion beam processing method (FIB), or the like may be used.

Further, a diffraction grating of a resist material may be formed on the chip of the quartz crystal AT resonator, and a metal film or a mirror film made of a dielectric multilayer film may be provided therein. By providing the metal film or the mirror film, the reflectance of the diffraction grating 34 can be increased.

Further, the metal film or the mirror film may be formed on a processed surface after forming the resist film is on the chip or the wafer of the quartz crystal AT resonator, performing etching processing, and then removing the resist film. In this case, since the resist material is removed, the influence of moisture absorption of the resist material or the like is eliminated, and the stability of the diffraction grating 34 can be improved. Further, by providing a highly conductive metal film such as Au or Al, it is also possible to be used as an electrode for driving the vibrator 30.

The diffraction grating 34 may be formed by using a technique such as anodized alumina (porous alumina).

1.5.3. Optical Modulator According to Another Configuration Example

The vibrator 30 is not limited to the quartz crystal resonator, and may be, for example, a Si resonator, a surface acoustic wave (SAW) device, or the like.

Figure 4:
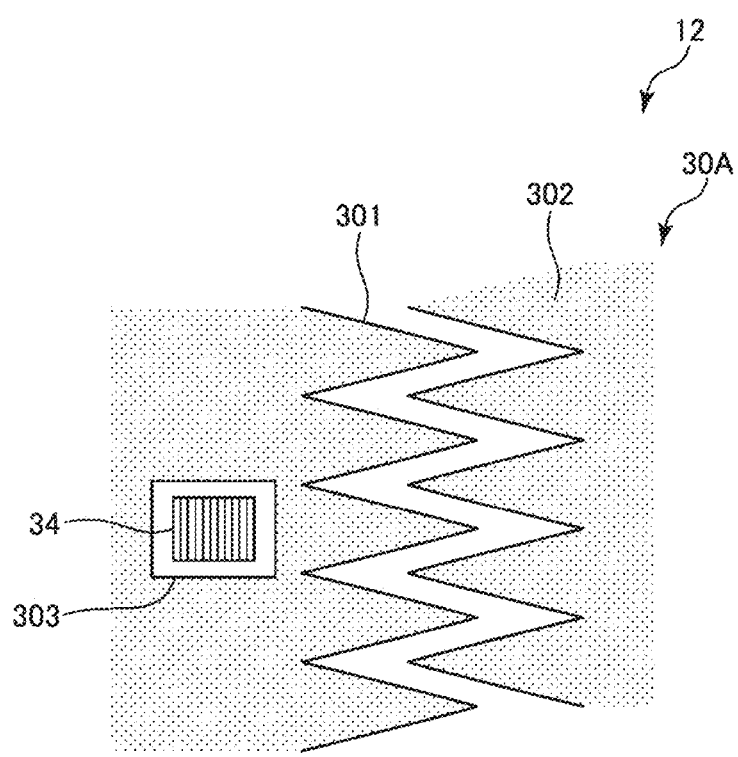
FIG. 4 is a plan view showing a part of a second configuration example of the optical modulator.
Figure 5:
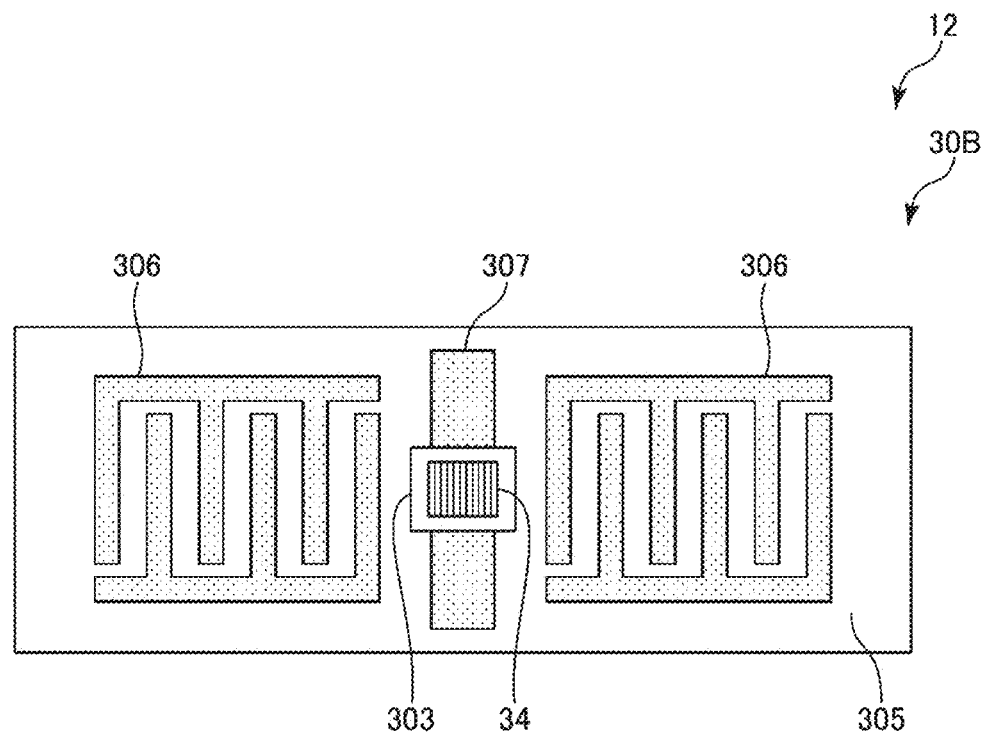
FIG. 5 is a plan view showing a third configuration example of the optical modulator.

FIG. 4 is a plan view showing a part of a second configuration example of the optical modulator 12. FIG. 5 is a plan view showing a third configuration example of the optical modulator 12.

A vibrator 30A shown in FIG. 4 is a Si resonator manufactured by using the MEMS technique. MEMS stands for Micro Electro Mechanical Systems.

The vibrator 30A includes a first electrode 301 and a second electrode 302 adjacent to each other on the same plane with a gap, a diffraction grating mounting portion 303 provided on the first electrode 301, and the diffraction grating 34 provided on the diffraction grating mounting portion 303. For example, the first electrode 301 and the second electrode 302 vibrate in the left-right direction of FIG. 4 so as to repeatedly approach and separate from each other by using an electrostatic attraction force as a driving force. Thereby, in-plane vibration can be applied to the diffraction grating 34. The oscillation frequency of the Si resonator is, for example, about 1 kHz to several hundred MHz.

A vibrator 30B shown in FIG. 5 is a SAW device that utilizes surface waves. SAW stands for a Surface Acoustic Wave.

The vibrator 30B includes a piezoelectric substrate 305, inter digital transducers 306 provided on the piezoelectric substrate 305, a ground electrode 307, the diffraction grating mounting portion 303, and the diffraction grating 34. When an AC voltage is applied to the inter digital transducer, the surface wave is excited by the piezoelectric effect. Thereby, in-plane vibration can be applied to the diffraction grating 34. The oscillation frequency of the SAW device is, for example, several hundred MHz to several GHz.

By providing the diffraction grating 34 in the above-mentioned device as well, optical modulation can be performed by the principle to be described later, as in the case of the quartz crystal AT resonator.

On the other hand, when the vibrator 30 has the quartz crystal resonator, a highly accurate modulated signal can be generated by utilizing an extremely high Q value of the quartz crystal. The Q value is an index showing the sharpness of the peak of resonance. Further, as a feature of the quartz crystal resonator, it is not easily affected by disturbance. Therefore, by using the modulated signal modulated by the optical modulator 12 including the quartz crystal resonator, a sample signal derived from the object 14 to be measured can be acquired with high accuracy.

1.5.4. Optical Modulation by Vibrator

Next, the principle of modulating light by using the optical modulator 12 shown in FIG. 3 will be described.

Figure 6:
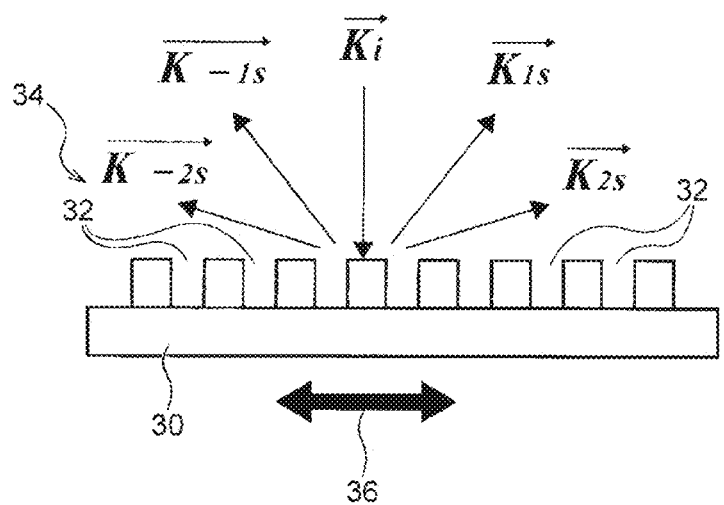
FIG. 6 is a conceptual diagram illustrating that a plurality of diffracted light beams are generated when incident light is incident in a direction perpendicular to a surface of a vibrator shown in FIG. 3.

FIG. 6 is a conceptual diagram illustrating that a plurality of diffracted light beams are generated when incident light $K_i$ is incident in a direction perpendicular to the surface of the vibrator 30 shown in FIG. 3.

When the incident light $K_i$ is incident on the diffraction grating 34 that is vibrating by thickness sliding along the vibration direction 36, a plurality of diffracted light beams $K_{ns}$ are generated as shown in FIG. 6 due to the diffraction phenomenon. n is the order of the diffracted light $K_{ns}$, and n=0, ±1, ±2, . . . . It is to be noted that, in FIG. 6, the diffraction grating 34 is not the blazed diffraction grating shown in FIG. 3, but a diffraction grating made by repeated irregularities as an example of another diffraction grating.

In FIG. 6, the incident light $K_i$ is incident in a direction perpendicular to the surface of the vibrator 30; however, the incident angle is not particularly limited and may be set so that the incident light is obliquely incident on the surface of the vibrator 30. When the light is incident at an angle, the traveling direction of the diffracted light beam $K_{ns}$ also changes accordingly.

Depending on the design of the diffraction grating 34, a higher-order light beam of |n|≥2 may not appear. Therefore, in order to obtain a stable modulated signal, it is desirable to set |n|=1. That is, in the laser interferometer 1 of FIG. 2, the frequency shifter type optical modulator 12 is preferably arranged so that the ±1st-order diffracted light is used as the reference light L2. With this arrangement, it is possible to achieve stabilization of measurement by the laser interferometer 1.

On the other hand, when higher-order light of |n|≥2 appears from the diffraction grating 34, the optical modulator 12 may be arranged so that any diffracted light of ±2nd order or higher is used as the reference light L2 instead of the ±1st-order diffracted light. Thereby, higher-order diffracted light can be used, and thus the laser interferometer 1 can be made higher in frequency and smaller in size.

In the present embodiment, as an example, the optical modulator 12 is configured such that the angle formed by an entering direction of the incident light $K_i$ incident on the optical modulator 12 and the traveling direction of the reference light L2 emitted from the optical modulator 12 is 180°. Hereinafter, three configuration examples will be described.

Figure 7:
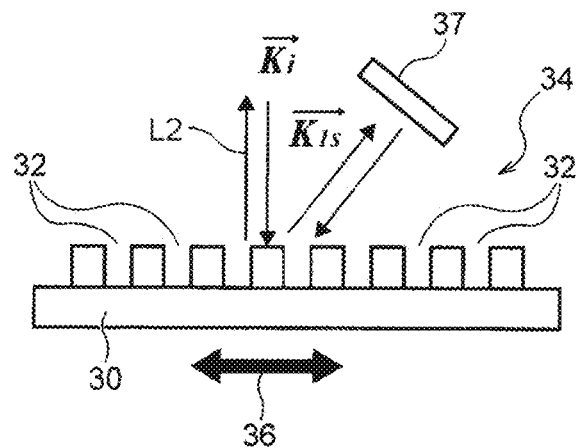
FIG. 7 is a conceptual diagram illustrating an optical modulator configured such that an angle formed by a traveling direction of incident light and a traveling direction of reference light is 180°.
Figure 8:
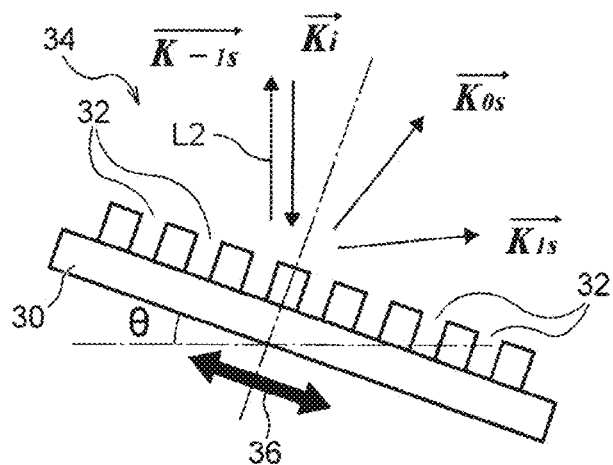
FIG. 8 is a conceptual diagram illustrating an optical modulator configured such that the angle formed by the traveling direction of the incident light and the traveling direction of the reference light is 180°.
Figure 9:
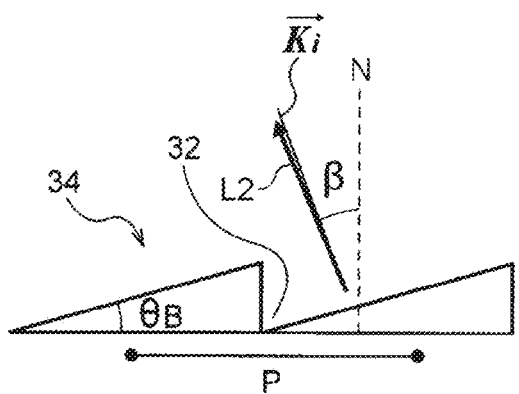
FIG. 9 is a conceptual diagram illustrating an optical modulator configured such that the angle formed by the traveling direction of the incident light and the traveling direction of the reference light is 180°.

FIGS. 7 to 9 are conceptual diagrams illustrating the optical modulator 12 configured such that an angle formed by the traveling direction of the incident light $K_i$ and the traveling direction of the reference light L2 is 180°.

In FIG. 7, the optical modulator 12 includes a mirror 37 in addition to the vibrator 30. The mirror 37 is arranged so as to reflect diffracted light $K_{1s}$ and return it to the diffraction grating 34. At this time, the angle formed by the incident angle of the diffracted light $K_{1s}$ with respect to the mirror 37 and the reflection angle of the mirror 37 is 180°. As a result, the diffracted light $K_{1s}$ emitted from the mirror 37 and returned to the diffraction grating 34 is diffracted again by the diffraction grating 34, and travels in the direction opposite to the traveling direction of the incident light $K_i$ incident on the optical modulator 12. Therefore, by adding the mirror 37, it is possible to satisfy the condition that the angle formed by the entering direction of the incident light $K_i$ and the traveling direction of the reference light L2 is 180°, as described above.

Further, by passing through the mirror 37 in this way, the reference light L2 generated by the optical modulator is frequency-modulated twice. Therefore, by using the mirror 37 together, the frequency modulation of a high frequency becomes possible as compared with the case where the vibrator 30 alone is used.

In FIG. 8, the vibrator 30 shown in FIG. 6 is tilted at an inclination angle θ. The inclination angle θ at this time is set so as to satisfy the condition that the angle formed by the entering direction of the incident light $K_i$ and the traveling direction of the reference light L2 is 180°.

The diffraction grating 34 shown in FIG. 9 is a blazed diffraction grating having a blaze angle $\theta_B$. Then, when the incident light $K_i$ traveling at an incident angle β is incident on the diffraction grating 34 with respect to a normal line N on the surface of the vibrator 30, the reference light L2 returns at the same angle as the blaze angle $\theta_B$ with respect to the normal line N. Therefore, by making the incident angle β equal to the blaze angle $\theta_B$, it is possible to satisfy the condition that the angle formed by the entering direction of the incident light $K_i$ and the traveling direction of the reference light L2 is 180°, as described above. In this case, since the above conditions can be satisfied without using the mirror 37 shown in FIG. 7 and without tilting the vibrator 30 itself as shown in FIG. 8, the laser interferometer 1 can be further miniaturized and have a higher frequency. In particular, in the case of a blazed diffraction grating, an arrangement satisfying the above conditions is called a "Littrow arrangement", and there is an advantage that the diffraction efficiency of the diffracted light can be particularly improved.

A pitch P in FIG. 9 represents the pitch of the blazed diffraction grating, and as an example, the pitch P is 1 μm. The blaze angle $\theta_B$ is 25°. In this case, in order to satisfy the above conditions, the incident angle β with respect to the normal line N of the incident light $K_i$ may be set to 25°.

2. Signal Generator

As shown in FIGS. 1 and 2, the signal generator 54 outputs the drive signal S1 input to the optical modulator 12 of the optical system 50. Further, the signal generator 54 outputs the reference signal S2 input to the demodulation circuit 52.

The signal generator 54 may be any oscillator that can generate a signal having good characteristics such as frequency stability and low jitter. Specific examples of the signal generator 54 include a function generator, a signal generator, a quartz crystal oscillator, a phase locked loop (PLL) circuit, and the like.

The signal generator 54 may be provided with a temperature controller that creates a constant temperature environment, if necessary. Thereby, the temperature of the oscillator can be kept constant. As a result, the signal generator 54 can generate a signal having good characteristics even in an environment where the temperature changes drastically. For example, a Peltier element can be used as the temperature controller.

3. Demodulation Circuit

The demodulation circuit 52 performs a demodulation process for demodulating a sample signal derived from the object 14 to be measured from the light reception signal output from the photodetector 10. The sample signal is, for example, a phase signal or a frequency signal. Displacement information of the object 14 to be measured can be acquired from the phase signal. Further, velocity information of the object 14 to be measured can be acquired from the frequency signal. If different information can be acquired in this way, the function as a displacement meter or a velocimeter can be provided, so that the laser interferometer 1 can be enhanced in functionality.

The circuit configuration of the demodulation circuit 52 is set according to the modulation processing method. In the laser interferometer 1 according to the present embodiment, the optical modulator 12 including the vibrator 30 is used. Since the vibrator 30 is a simple vibrator, the vibration velocity changes from moment to moment. Therefore, the modulation frequency also changes, and the demodulation circuit in the related art cannot be used as it is.

The demodulation circuit in the related art refers to a circuit that demodulates a sample signal from a light reception signal including a modulated signal modulated by using an acousto-optic modulator (AOM). In the acousto-optic modulator, the modulation frequency does not change. Therefore, the demodulation circuit in the related art can demodulate the sample signal from the light reception signal including a modulated signal modulated by the optical modulator whose modulation frequency does not change. However, when a modulated signal modulated by the optical modulator 12 whose modulation frequency changes is included, the modulated signal cannot be demodulated as it is.

Therefore, the demodulation circuit 52 shown in FIG. 1 includes a preprocessing section 53 and a demodulation section 55. The light reception signal output from the photodetector 10 is first passed through the preprocessing section 53 and then guided to the demodulation section 55. The preprocessing section 53 preprocesses the light reception signal. By this preprocessing, a signal that can be demodulated by the demodulation circuit in the related art can be obtained. Therefore, in the demodulation section 55, the sample signal derived from the object 14 to be measured is demodulated by a known demodulation method.

3.1. Configuration of Preprocessing Section

The preprocessing section 53 shown in FIG. 1 includes a first bandpass filter 534, a second bandpass filter 535, a first delay adjuster 536, a second delay adjuster 537, a multiplier 538, a third bandpass filter 539, a first AGC 540, a second AGC 541, and a summer 542. AGC stands for an Auto Gain Control.

Further, a current-voltage converter 531 and an ADC 532 are coupled in this order from the photodetector 10 side between the preprocessing section 53 and the photodetector 10.

Further, an ADC 533 is coupled between the signal generator 54 and the second delay adjuster 537.

The current-voltage converter 531 is a transimpedance amplifier, which converts a current output from the photodetector 10 into a voltage signal. The ADCs 532 and 533 are analog-to-digital converters, which convert an analog signal into a digital signal with a predetermined number of sampling bits.

The first bandpass filter 534, the second bandpass filter 535, and the third bandpass filter 539 are filters that selectively transmit signals in a specific frequency band.

The first delay adjuster 536 and the second delay adjuster 537 are circuits that adjust the signal delay. The multiplier 538 is a circuit that generates an output signal proportional to the product of two input signals. The first AGC 540 and the second AGC 541 are circuits that align the amplitudes of signals with each other. The summer 542 is a circuit that generates an output signal proportional to the sum of two input signals.

The current output which is output from the photodetector 10 is converted into a voltage signal by the current-voltage converter 531. The voltage signal is converted into a digital signal by the ADC 532 and divided into a first signal and a second signal.

After the first signal is passed through the first bandpass filter 534, a group delay is adjusted by the first delay adjuster 536. The group delay adjusted by the first delay adjuster 536 corresponds to a group delay of the second signal by the second bandpass filter 535, which will be described later. Due to this delay adjustment, the delay time associated with the passage of the filter circuit can be made uniform between the first bandpass filter 534 through which the first signal passes and the second bandpass filter 535 and the third bandpass filter 539 through which the second signal passes. The first signal that has passed through the first delay adjuster 536 is input to the summer 542 via the first AGC 540.

The second signal is passed through the second bandpass filter 535 and then input to the multiplier 538. In the multiplier 538, a reference signal $\cos(\omega_m t)$ output from the second delay adjuster 537 is multiplied by the second signal. Specifically, the reference signal S2 output from the signal generator 54 is digitally converted by the ADC 533, the phase is adjusted by the second delay adjuster 537, and the converted signal is output to the multiplier 538. After that, the second signal is passed through the third bandpass filter 539 and then input to the summer 542 via the second AGC 541. In the summer 542, an output signal proportional to the sum of the first signal and the second signal is output to the demodulation section 55.

3.2. Principle of Preprocessing by Preprocessing Section

Next, the principle of preprocessing in the preprocessing section 53 will be described. First, when $$E_m = a_m \cos\{2\pi(f_0 t + \int f_m(t)dt) + \phi_{m0}\} \quad (1)$$

$$E_d = a_d \cos\{2\pi(f_0 t + \int f_d(t)dt) + \phi_{d0}\} \quad (2)$$

$$\phi_0 = \phi_{m0} - \phi_{d0} \quad (3)$$

a light reception signal intensity $I_{PD}$ output from the photodetector 10 is theoretically represented by the following equation.

$$I_{PD} = \langle |E_m + E_d|^2 \rangle \quad (4)$$

$$= \langle |E_m^2 + E_d^2 + 2E_m E_d| \rangle$$

$$= \left\langle a_m^2 \cos^2 2\pi \left( f_0 t + \int f_m(t) dt + \phi_{m0} \right) + a_d^2 \cos^2 2\pi \left( f_0 t + \int f_d(t) dt + \phi_{d0} \right) + \right.$$

$$2 a_m a_d \cos 2\pi \left( f_0 t + \int f_m(t) dt + \phi_{m0} \right) \cdot \cos 2\pi \left( f_0 t + \int f_d(t) dt + \phi_{d0} \right) \right\rangle$$

$$= \left\langle a_m^2 \cos^2 2\pi \left( f_0 t + \int f_m(t) dt + \phi_{m0} \right) + a_d^2 \cos^2 2\pi \left( f_0 t + \int f_d(t) dt + \phi_{d0} \right) + \right.$$

$$a_m a_d \left\{ \cos 2\pi \left( 2 f_0 t + \int (f_m(t) + f_d(t)) dt + \phi_{m0} + \phi_{d0} \right) + \right.$$

$$\left. \cos 2\pi \left( \int (f_m(t) - f_d(t)) dt + \phi_0 \right) \right\} \right\rangle$$

$$= \frac{a_m^2 + a_d^2}{2} + a_m a_d \left\{ \cos 2\pi \left( \int (f_m(t) - f_d(t)) dt + \phi_0 \right) \right\}$$

$E_m$, $E_d$, $\varphi_{m0}$, $\varphi_{d0}$, $\varphi_0$, $f_m(t)$, $f_d(t)$, $f_0$, $a_m$, and $a_d$ are as follows.

$E_m$: Electric field component of modulated signal
$E_d$: Electric field component of sample signal derived from object to be measured
$\varphi_{m0}$: Initial phase value of optical path 20
$\varphi_{d0}$: Initial phase value of optical path 22
$\varphi_0$: Optical path phase difference of laser interferometer
$f_m(t)$: Frequency of modulated signal derived from optical modulator
$f_d(t)$: Frequency of sample signal derived from object to be measured
$f_0$: Frequency of emission light emitted from light source
$a_m$: Coefficient
$a_d$: Coefficient Further, < > in the equation (4) represents a time average. $f_0$ is about 300 THz as an example, $f_m(t)$ is about 100 kHz to 100 MHz as an example, and $f_d(t)$ is about 1 kHz to 10 MHz as an example.

The first term of the above equation (4) represents a DC component, and the second term represents an AC component. When this AC component is referred to as $I_{PD\cdot AC}$, $I_{PD\cdot AC}$ is as follows.

$$I_{PDAC} = a_m a_d \left\{ \cos 2\pi \left( \int (f_m(t) - f_d(t)) dt + \phi_0 \right) \right\} \quad (5)$$

$$= a_m a_d \cos \left( \frac{f_{mdmax}}{f_m} \sin 2\pi f_m t + X(t) \right)$$

$$2\pi \int f_m(t) dt = \frac{f_{mdmax}}{f_m} \sin 2\pi f_m t \quad (6)$$

$$X(t) = -\int f_d(t) dt + \phi_0 \quad (7)$$

$f_{mdmx}$: Doppler shift of modulated signal derived from optical modulator $f_m$: Modulation frequency of optical modulator Further, $I_{PD\cdot AC}$ can be transformed as follows.

$$I_{PDAC} = A \cos(B \sin 2\pi f_m t + X(t)) \quad (8)$$

$$= A \{ \cos B \sin 2\pi f_m t \cdot \cos X(t) - \sin B \sin 2\pi f_m t \cdot \sin X(t) \}$$

$$A = a_m a_d \quad (9)$$

$$B = \frac{f_{mdmax}}{f_m} \quad (10)$$

Here, a v-order Bessel function as shown in the following equation is known.

$$\cos \{ \zeta \sin(2\pi f_v t) \} = J_0(\zeta) + 2J_2(\zeta) \cos(2 \cdot 2\pi f_v t) + 2J_4(\zeta) \cos(4 \cdot 2\pi f_v t) + \ldots \quad (11)$$

$$\sin \{ \zeta \sin(2\pi f_v t) \} = 2J_1(\zeta) \sin(1 \cdot 2\pi f_v t) + 2J_3(\zeta) \sin(3 \cdot 2\pi f_v t) + \ldots \quad (12)$$

When the above equation (8) is series-expanded using the Bessel functions of the above equations (11) and (12), equation (8) can be transformed as follows.

$$I_{PD\cdot AC} = A[\{ J_0(B) + 2J_2(B) \cos(2 \cdot 2\pi f_m t) + 2J_4(B) \cos(4 \cdot 2\pi f_m t) + \ldots \} \cos X(t) - \{ 2J_1(B) \sin(1 \cdot 2\pi f_m t) + 2J_3(B) \sin(3 \cdot 2\pi f_m t) + \ldots \} \sin X(t) ] \quad (13)$$

However, $J_0(B)$, $J_1(B)$, $J_2(B)$ . . . are Bessel coefficients, respectively.

The relationship between the order of the vibration frequency and the coefficient in each of the expanded terms is shown in Table 1 below.

TABLE 1

| Vibration frequency (angular frequency) | DC | $1 \cdot 2\pi fm$ ($1 \cdot \omega m$) | $2 \cdot 2\pi fm$ ($2 \cdot \omega m$) | $3 \cdot 2\pi fm$ ($3 \cdot \omega m$) | $4 \cdot 2\pi fm$ ($4 \cdot \omega m$) | $5 \cdot 2\pi fm$ ($5 \cdot \omega m$) | $6 \cdot 2\pi fm$ ($6 \cdot \omega m$) |
|---|---|---|---|---|---|---|---|
| Coefficient | $AJ_0(B)\cos X$ | $2AJ_1(B)\sin X$ | $2AJ_2(B)\cos X$ | $2AJ_3(B)\sin X$ | $2AJ_4(B)\cos X$ | $2AJ_5(B)\sin X$ | $2AJ_6(B)\cos X$ |

When expanded as described above, it can be said that theoretically, the band corresponding to a specific order can be extracted by a bandpass filter.

Therefore, the preprocessing section 53 described above preprocesses the light reception signal in the following flow based on this theory.

First, the digital signal output from the above-mentioned ADC 532 is divided into two, a first signal and a second signal. The first signal is passed through the first bandpass filter 534. The central angular frequency of the first bandpass filter 534 is set to $\omega_m$. Accordingly, the first signal after passing through the first bandpass filter 534 is represented by the following equation as a result of further adjusting the phase and amplitude with the first delay adjuster 536 and the first AGC 540.

$$I_{pass1} = C \sin(2\pi f_m t) \cdot \sin X(t) \quad (14)$$

On the other hand, the second signal is passed through the second bandpass filter 535. The central angular frequency of the second bandpass filter 535 is set to a value different from the central angular frequency of the first bandpass filter 534. Here, as an example, the central angular frequency of the second bandpass filter 535 is set to $2\omega_m$. As a result, the second signal after passing through the second bandpass filter 535 is represented by the following equation.

$$I_{BPF2} = 2J_2(B)\cos(2 \cdot 2\pi f_m t) \cdot \cos X(t) \quad (15)$$
$$= J_2(B)\{\cos(2 \cdot 2\pi f_m t + X(t)) + \cos(2 \cdot 2\pi f_m t - X(t))\}$$

The second signal after passing through the second bandpass filter 535 is multiplied by the reference signal $\cos(\omega_m t)$ by the multiplier 538. The second signal after multiplication is represented by the following equation.

$$I_{\cos(\omega_m t)} = J_2(B)\{\cos(2 \cdot 2\pi f_m t + X(t)) + \cos(2 \cdot 2\pi f_m t - X(t))\} \cdot \cos(2\pi f_m t) \quad (16)$$
$$= J_2(B)\{\cos(3 \cdot 2\pi f_m t + X(t)) + \cos(1 \cdot 2\pi f_m t + X(t)) +$$
$$\cos(3 \cdot 2\pi f_m t - X(t)) + \cos(1 \cdot 2\pi f_m t - X(t))\}$$

The second signal after passing through the multiplier 538 is passed through the third bandpass filter 539. The central angular frequency of the third bandpass filter 539 is set to the same value as the central angular frequency of the first bandpass filter 534. Here, as an example, the central angular frequency of the third bandpass filter 539 is set to $\omega_m$. Accordingly, the second signal after passing through the third bandpass filter 539 is represented by the following equation.

$$I_{BPF3} = J_2(B)\{\cos(2\pi f_m t + X(t)) + \cos(2\pi f_m t - X(t))\} \quad (17)$$
$$= 2J_2(B)\cos(2\pi f_m t) \cdot \cos X(t)$$

The second signal after passing through the third bandpass filter 539 is represented by the following equation as a result of aligning of the amplitude with that of the first signal by the second AGC 541.

$$I_{pass2} = C \cos(2\pi f_m t) \cdot \cos X(t) \quad (18)$$

The first signal represented by the above equation (14) and the second signal represented by the above equation (18) are summed by the summer 542. The summing result is represented by the following equation.

$$I_{53} = \cos(2\pi f_m t - X(t)) \quad (19)$$

As a result of the summation, the unnecessary term disappears and the necessary term can be taken out as in the above equation (19). This result is output to the demodulation section 55. Although the preprocessing section 53 has been described in the digital processing using the ADC, the preprocessing section 53 may have an analog circuit configuration without the ADC.

3.3. Configuration of Demodulation Section

The demodulation section 55 performs a demodulation process for demodulating a sample signal derived from the object 14 to be measured from the signal output from the preprocessing section 53. The demodulation process is not particularly limited, and examples thereof include a known orthogonal detection method. The orthogonal detection method is a method of performing the demodulation process by performing an operation of mixing signals orthogonal to each other from the outside with respect to an input signal.

The demodulation section 55 shown in FIG. 1 is a digital circuit including a first multiplier 551, a second multiplier 552, a phase shifter 553, a first low-pass filter 555, a second low-pass filter 556, a divider 557, an inverse tangent calculator 558, and a signal output circuit 559.

3.4. Principle of Demodulation Process by Demodulation Section

In the demodulation process, first, the signal output from the preprocessing section 53 is divided into two. The first multiplier 551 multiplies one of the divided signals by a frequency signal $\cos(\omega_m t)$, which is the reference signal S2 output from the signal generator 54. The second multiplier 552 multiplies the other of the divided signals by a frequency signal $-\sin(\omega_m t)$ obtained by shifting the phase of the reference signal S2 output from the signal generator 54 by $-90°$ by the phase shifter 553. The frequency signal $\cos(\omega_m t)$ and the frequency signal $-\sin(\omega_m t)$ are signals that are $90°$ out of phase with each other.

The signal passed through the first multiplier 551 is passed through the first low-pass filter 555 and then input to the divider 557 as a signal x. The signal passed through the second multiplier 552 is also passed through the second low-pass filter 556, and then input to the divider 557 as a signal y. The divider 557 divides the signal y by the signal x, passes the signal y/x through the inverse tangent calculator 558, and obtains a signal a tan(y/x).

After that, by passing the signal a tan(y/x) through the signal output circuit 559, a phase $\varphi_d$ is obtained as the sample signal derived from the object 14 to be measured. Then, the displacement information of the object 14 to be measured can be calculated based on the phase $\varphi_d$. Thereby, a displacement meter that measures the displacement of the object 14 to be measured is realized. In addition, velocity information can be obtained from the displacement information. Thereby, a velocimeter that measures the velocity of the object 14 to be measured is realized.

Although the circuit configuration of the demodulation section 55 has been described above, the circuit configuration of the above digital circuit is an example and is not limited thereto. Further, the demodulation section 55 is not limited to a digital circuit, and may be an analog circuit. The analog circuit may include a frequency voltage (F/V) converter circuit and a ΔΣ counter circuit.

Further, in the circuit configuration of the demodulation section 55 described above, a frequency signal may be obtained as a sample signal derived from the object 14 to be measured. The velocity information of the object 14 to be measured can be calculated based on the frequency signal.

4. Output of Drive Signal and Reference Signal by Signal Generator

As described above, the signal generator 54 outputs a signal to both the optical system 50 and the demodulation circuit 52.

Specifically, the signal generator 54 outputs the drive signal S1 to the vibrator 30 included in the optical modulator 12. Thereby, the vibrator 30 oscillates. On the other hand, the signal generator 54 outputs the reference signal S2 to the preprocessing section 53 included in the demodulation circuit 52.

In the present embodiment, since the vibrator 30 is used for the optical modulator 12, the electric power required to drive the vibrator 30 can be small as described above. Specifically, when the voltage of the reference signal S2 is Vr and the voltage of the drive signal S1 is Vd, if the voltage Vd of the drive signal S1 is less than 10 times the voltage Vr of the reference signal S2, an amplifier having a large amplification factor is not used, and the size of the laser interferometer 1 can be reduced accordingly.

The voltage Vd refers to the voltage immediately before the drive signal S1 is input to the vibrator 30. The voltage Vr also refers to the voltage immediately before the reference signal S2 is input to the preprocessing section 53.

Further, a large amplification factor means that the amplification factor is 10 times or more. For example, in the case of an acousto-optic modulator (AOM) or an electro-optical modulator (EOM), which is an optical modulator in the related art, the voltage of the drive signal is required to be 100 V or more. Thus, considering the relationship with the reference signal, an amplifier that amplifies the drive signal 10 times or more is required.

As described above, the laser interferometer 1 according to the present embodiment includes the light source 2, the optical modulator 12, the photodetector 10, the demodulation circuit 52, and the signal generator 54. The light source 2 emits the emission light L1 (first laser light). The optical modulator 12 includes the vibrator 30, and modulates the emission light L1 using the vibrator 30 to generate the reference light L2 (second laser light) including a modulated signal. The photodetector 10 receives interference light between the object light L3 (third laser light) including a signal, which is derived from the object to be measured (object), generated by reflecting the emission light L1 on the object 14 to be measured and the reference light L2 to output a light reception signal. The demodulation circuit 52 demodulates the signal derived from the object 14 to be measured from the light reception signal based on the reference signal S2. The signal generator 54 outputs the reference signal S2 input to the demodulation circuit 52 and outputs the drive signal S1 input to the optical modulator 12.

Then, the voltage Vr of the reference signal S2 and the voltage Vd of the drive signal S1 satisfy Vd/Vr<10.

According to such a configuration, it is not necessary to use an amplifier or the like that amplifies the drive signal S1 input to the optical modulator 12 with a large amplification factor, so that the size of the laser interferometer 1 can be reduced.

Further, since it is possible to prevent a phase shift or the like from occurring in the modulated signal due to the amplification, it is possible to suppress a decrease in the demodulation accuracy of the information derived from the object 14 to be measured.

Here, the configuration of a laser interferometer in the related art and the configuration of the laser interferometer 1 according to the present embodiment are compared.

Figure 10:
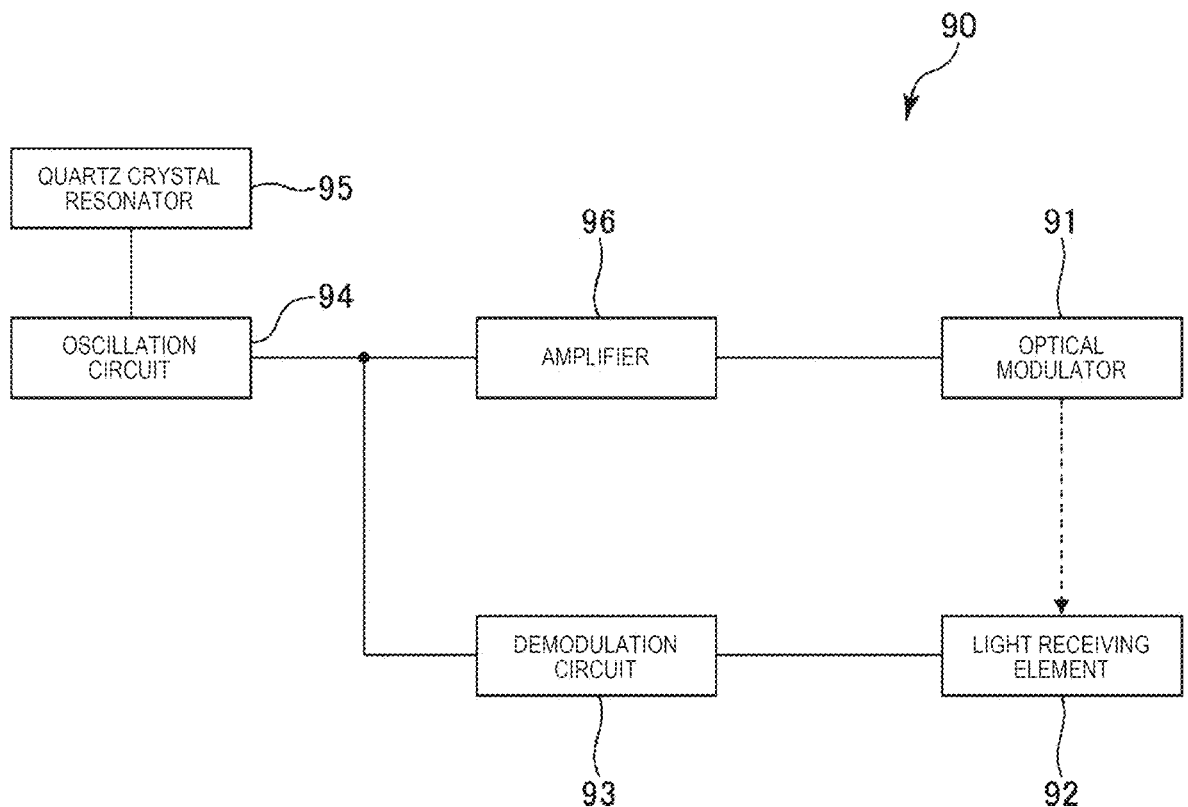
FIG. 10 is a diagram showing a simplified configuration of a laser interferometer in the related art.
Figure 11:
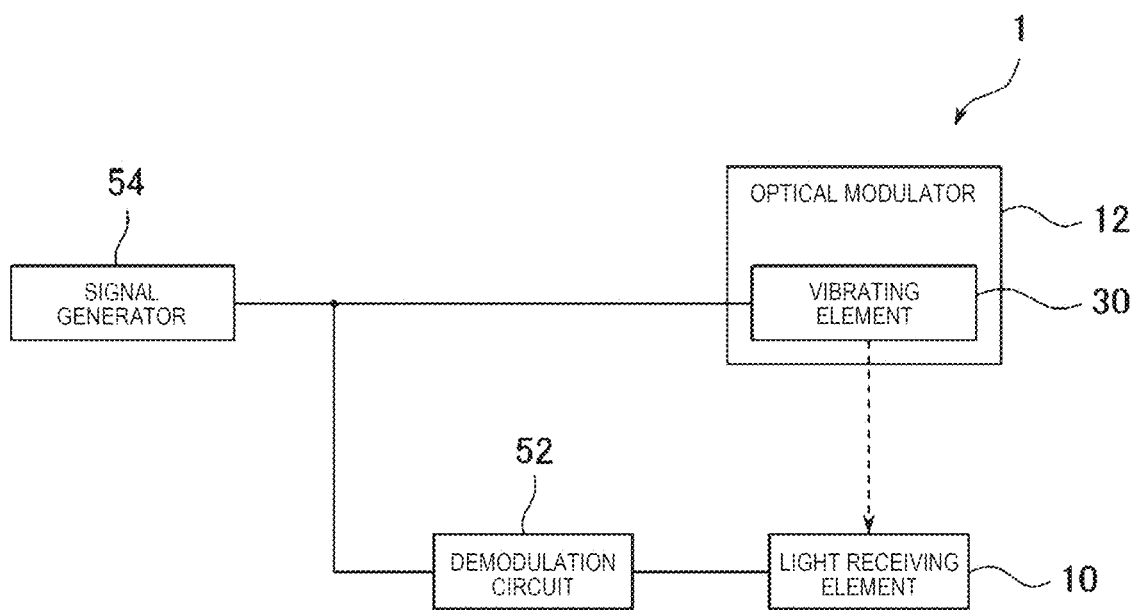
FIG. 11 is a diagram showing a simplified configuration of the laser interferometer of FIG. 1.

FIG. 10 is a diagram showing a simplified configuration of a laser interferometer in the related art. FIG. 11 is a diagram showing a simplified configuration of the laser interferometer 1 of FIG. 1.

A laser interferometer 90 in the related art shown in FIG. 10 includes an optical modulator 91 such as an acousto-optic modulator (AOM) and an electro-optical modulator (EOM), a photodetector 92, a demodulation circuit 93, an oscillation circuit 94, a quartz crystal resonator 95, and an amplifier 96. The oscillation circuit 94 generates a drive signal S1 by making the quartz crystal resonator 95 oscillate. Then, the drive signal S1 amplified by the amplifier 96 is input to the optical modulator 91 to operate the optical modulator 91. Further, the oscillation circuit 94 outputs a reference signal S2 necessary for demodulating the sample signal in the demodulation circuit 93.

In the laser interferometer 90 in the related art, the amplifier 96 having a large amplification factor is required between the oscillation circuit 94 and the optical modulator 91.

On the other hand, in the laser interferometer 1 shown in FIG. 11, since the vibrator 30 is used for the optical modulator 12, a large amount of electric power is not required. Therefore, an amplifier 96 having a small amplification factor is sufficient. Therefore, as shown in FIG. 11, the amplifier 96 can be omitted when amplification is not required.

Therefore, in the present embodiment, it is possible to realize the laser interferometer 1 which has been reduced in size while maintaining the demodulation accuracy.

Further, it is preferable that the voltage Vr of the reference signal S2 and the voltage Vd of the drive signal S1 satisfy Vd/Vr<2. When the voltage Vd of the drive signal S1 is less than twice the voltage Vr of the reference signal S2, it is not necessary to use an amplifier that amplifies the drive signal S1. Therefore, the laser interferometer 1 can be further made smaller.

5. Phase Amplitude

As can be seen from the principle of preprocessing by the preprocessing section 53 described above, in order to perform the preprocessing stably, both the signal component of $1 \cdot \omega_m$ and the signal component of $2 \cdot \omega_m$ shown in Table 1 described above are required among the AC components of the light reception signal.

Figure 12:
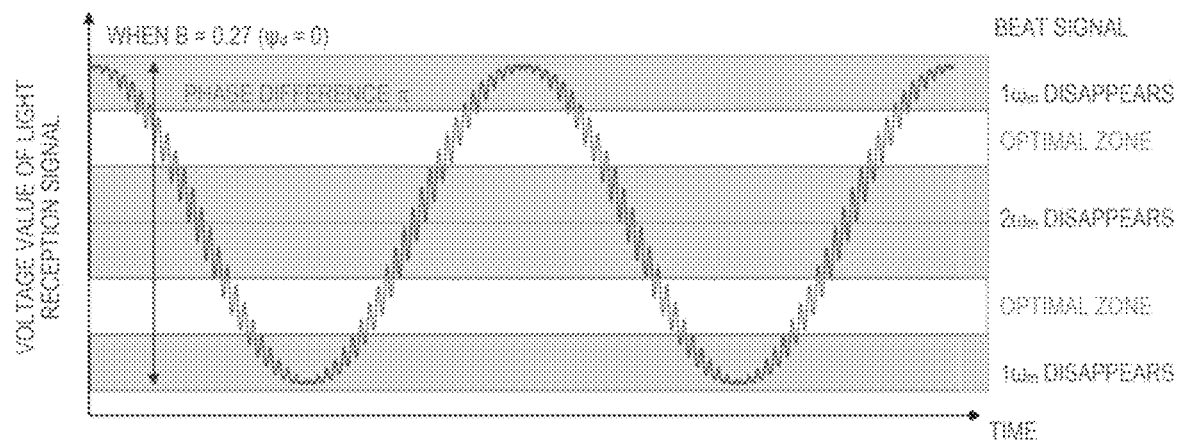
FIG. 12 is a graph showing an example of a waveform of a light reception signal.

FIG. 12 is a graph showing an example of a waveform of a light reception signal. As described above, the light reception signal is divided into a DC component and an AC component. In FIG. 12, in order to reproduce various states that an optical path phase difference $\varphi_0$ of the laser interferometer 1 can be taken, $\varphi_0$ is given a gentle periodic fluctuation. Therefore, in FIG. 12, the DC component $\cos(\varphi_0)$ corresponds to a long wave period, and the AC component $\cos(\psi_m - \psi_d + \varphi_0)$ corresponds to a short wave period. $\psi_m$ is the phase of the modulated signal by the optical modulator 12, and is represented by $\psi_m = B \sin(\omega_m t)$. $\psi_d$ is the phase of the sample signal derived from the object 14 to be measured. In FIG. 12, $\psi_d$=0. Further, as an example, B=0.27.

The long wave period and the short wave period will vary depending on the measurement conditions. Therefore, in order to perform stable measurement of the object 14 to be measured in any movement, it is required that the line representing the light reception signal falls within the two regions described as an "optimal zone" in FIG. 12. The optimal zone is a region in which both the signal component of $1 \cdot \omega_m$ and the signal component of $2 \cdot \omega_m$ described above appear in the AC component of the light reception signal. That is, when it is out of the optimal zone, as shown in FIG. 12, the signal component of $1 \cdot \omega_m$ disappears or the signal component of $2 \cdot \omega_m$ disappears.

Therefore, in order to enter the above-mentioned "optimal zone", it is sufficient that the amplitude of $\omega_m + \phi_0$ among the AC components is larger than $\pi/3$. Further, it is preferably larger than $\pi/2$.

Based on this, when the change amplitude of the phase $\psi_m$ of the modulated signal is $\Delta\psi_m$ and the change amplitude of the phase $\psi_d$ of the sample signal is $\Delta\psi_d$, it is sufficient that at least $\Delta\psi_m + \Delta\psi_d > \pi/3$ holds. Then, it is preferable that $\Delta\psi_m$ is as large as possible toward $\pi/3$. This enables stable measurement.

From the above equation of $\psi_m$=B $\sin(\omega_m t)$, the change amplitude $\Delta\psi_m$ of the phase $\psi_m$ of the modulated signal becomes a value of B. Therefore, when selecting the vibrator 30, it is preferable that the B value is as large as possible toward $\pi/3$. As an example, the B value is preferably more than 0.5, more preferably more than $\pi/3$. As a result, even if the displacement of the object 14 to be measured is smaller, stable measurement can be performed.

Further, the B value can be converted into the displacement amplitude $L_0$ of the vibrator 30. For example, when the wavelength of the emission light L1 is 632 nm, it is sufficient that $L_0$>69.5 nm in order to satisfy B>$\pi/3$. Further, when the wavelength of the emission light L1 is 850 nm, it is sufficient that $L_0$>93.4 nm in order to satisfy B>$\pi/3$. Therefore, when selecting the vibrator 30, the selection may be performed with the displacement amplitude $L_0$ as a guide.

These numerical values are obtained as follows.

From the above equation (10), B=$f_{mdmax}/f_m$. Further, $f_{mdmax}$=(4$\pi \cdot f_m \cdot L_0 \cdot \sin \theta$)/$\lambda$. $\lambda$ is the wavelength of the emission light L1 and e is the inclination angle shown in FIG. 8. Thereby, (4$\pi L_0 \sin \theta$)/$\lambda$>$\pi/3$ holds. As a result, $L_0$>$\lambda$/(12 $\sin \theta$). Therefore, for example, if $\theta$=49.3°, when $\lambda$=632 nm described above, $L_0$>69.5 nm [=632/{12×sin(49.3)}]. Further, when $\lambda$=850 nm, $L_0$>93.4 nm [=850/{12×sin(49.3)}].

6. Number of Sampling Bits in ADC Section

Figure 13:
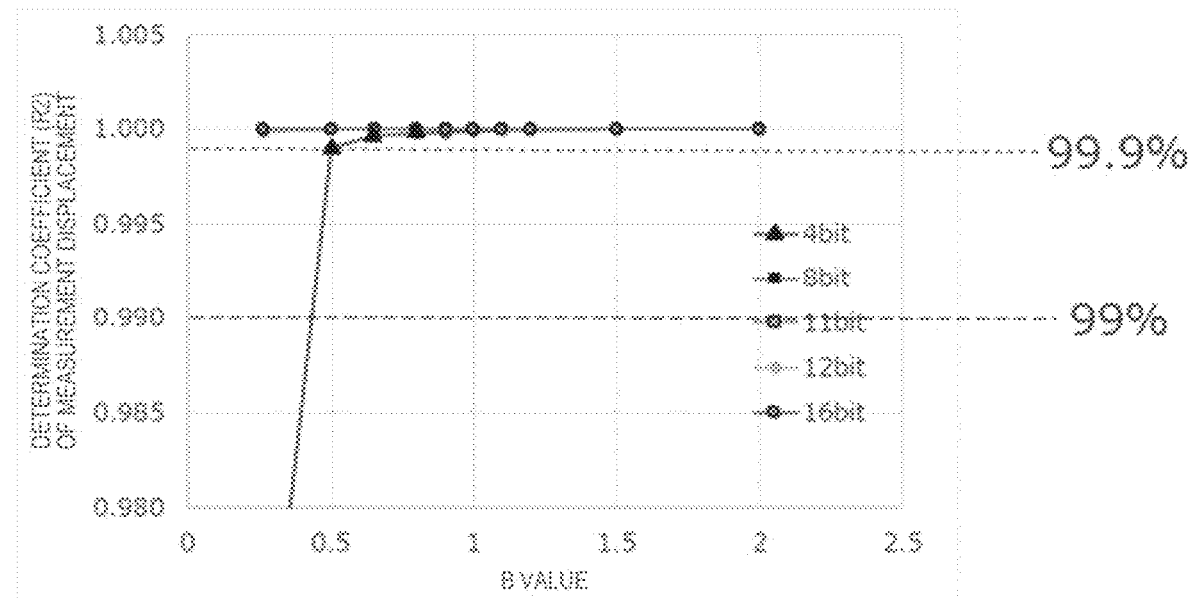
FIG. 13 is a graph showing relationships between a B value of a vibrator and a standard deviation and a determination coefficient (R2 value) of a measurement displacement, when a sample signal derived from an object to be measured is demodulated by a demodulation circuit and the displacement is measured.
Figure 13:
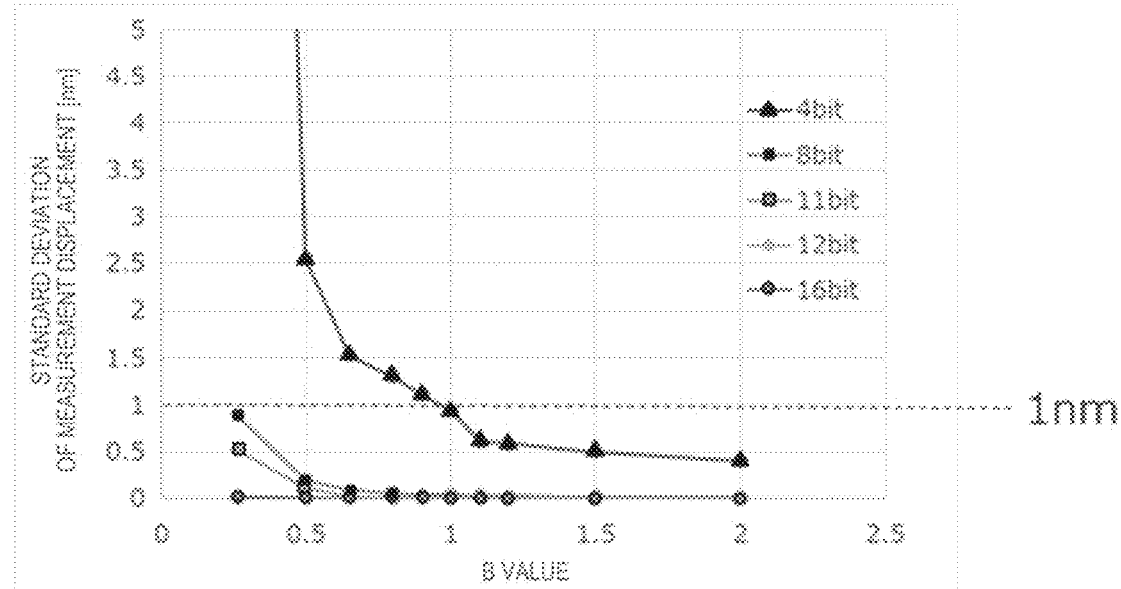

FIG. 13 is a graph showing relationships between a B value of a vibrator and a standard deviation and a determination coefficient (R2 value) of a measurement displacement, when a sample signal derived from the object 14 to be measured is demodulated by the demodulation circuit 52 and the displacement is measured. FIG. 13 shows the measurement results while changing the number of sampling bits of the ADC 532 shown in FIG. 1 to five stages of 4, 8, 11, 12, and 16 bits.

As an example, a sample vibrating at a vibration frequency of 10 kHz is used as the object 14 to be measured. The B value of the vibrator is changed between 0.265 and 2.000. Further, as the laser light, laser light having a wavelength of 850 nm emitted from the VCSEL is used.

As shown in FIG. 13, even in the case of 8 bits, which is the number of sampling bits of a general ADC, the target accuracy can be achieved regardless of the B value.

The target accuracy is as follows.

When the number of sampling bits is 8 bits or more, the standard deviation is 1 nm or less regardless of the B value. •When the number of sampling bits is 4 bits, the standard deviation is 1 nm or less when the B value is more than 1.0. •Regardless of the number of bits, the B value is more than 0.5 and the determination coefficient is 99.9% or more.

Looking at the transition of the standard deviation at 8 bits, it is recognized that the target accuracy is achieved with a sufficient margin if B≥0.5. Therefore, in the case of 8 bits or more, if B≥0.5, the robustness at the time of measurement can be sufficiently enhanced. Further, from the viewpoint of demodulation accuracy, it is recognized that the larger the B value is, the more advantageous it is.

In the upper figure of FIG. 13, data items other than the 4-bit data overlap at around 1.000 and they cannot be distinguished. Further, in the lower figure of FIG. 13, the 12-bit data and the 16-bit data substantially overlap at around 0 and they cannot be distinguished.

7. Signal Generation Conditions by Signal Generator

Figure 14:
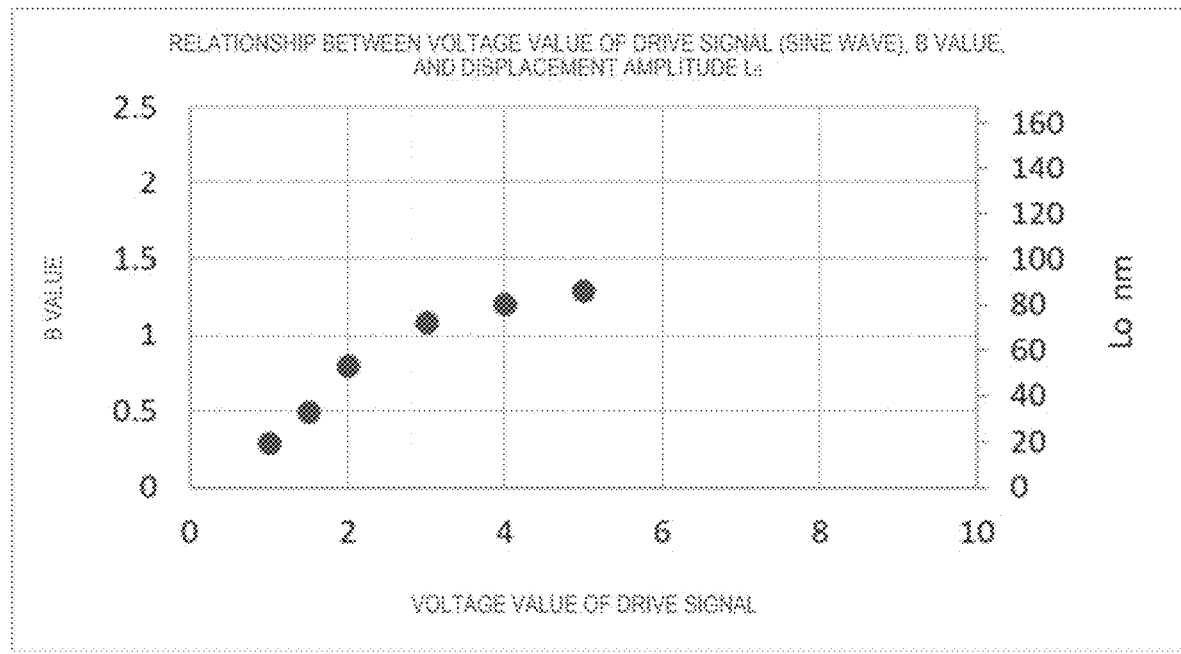
FIG. 14 is a graph showing a relationship between a voltage value of the drive signal and the B value, when a vibrator is excited by a signal generator.
Figure 14:
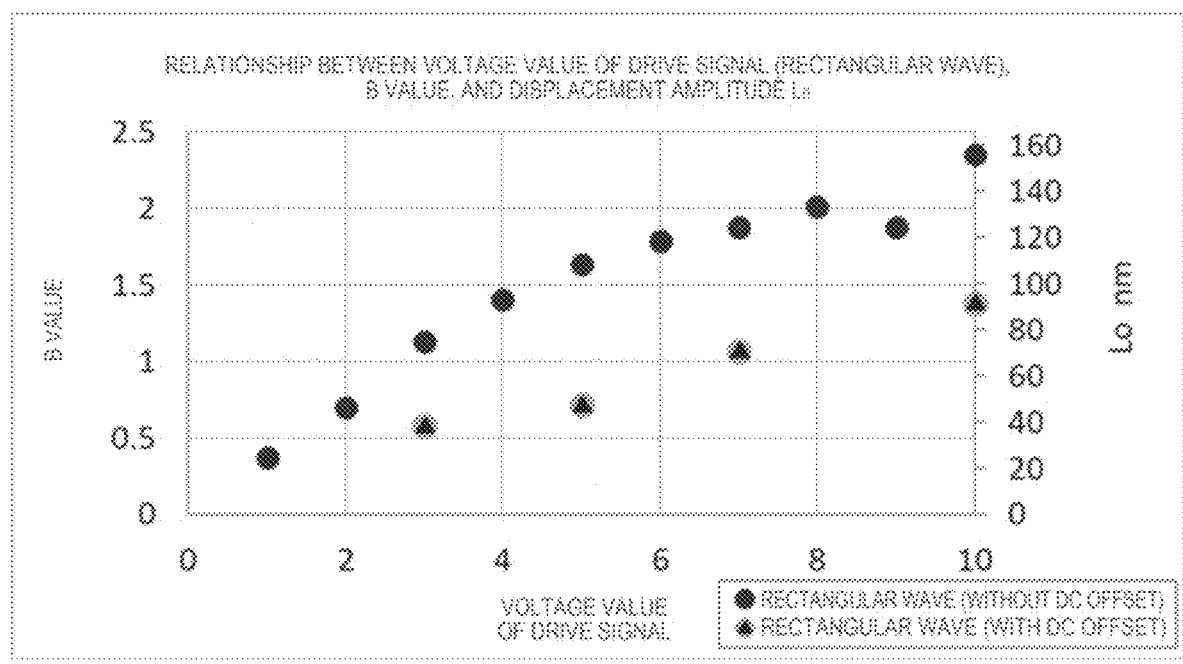

FIG. 14 is a graph showing a relationship between a voltage value of the drive signal and the B value, when the vibrator is excited by the signal generator 54. FIG. 14 separately shows a case where the drive signal for driving the same vibrator is a sine wave signal and a case where the drive signal is a rectangular wave signal. Further, the vertical axis of FIG. 14 shows a scale indicating the displacement amplitude of the vibrator together with the B value. A function generator is used to generate the drive signal.

When a sine wave drive signal is applied to the vibrator by the function generator, the B value becomes higher as the voltage value is increased. In the case of a sine wave, the B value can be made larger than $\pi/3$ by setting the voltage value to 3 V or more.

When a rectangular wave drive signal is applied to the vibrator, the data is further acquired separately for the case where the DC offset is set to zero and the case where the DC offset is set so that the lower limit value of the voltage becomes zero.

When a drive signal with the DC offset set to zero is applied, a large B value is obtained even with the same voltage value as compared with the case where the DC offset is set. Specifically, when the voltage value is 3 V or more, the B value becomes larger than $\pi/3$.

The influence of the difference in DC offset on the B value can be explained by the following principle.

Figures 15, 16:
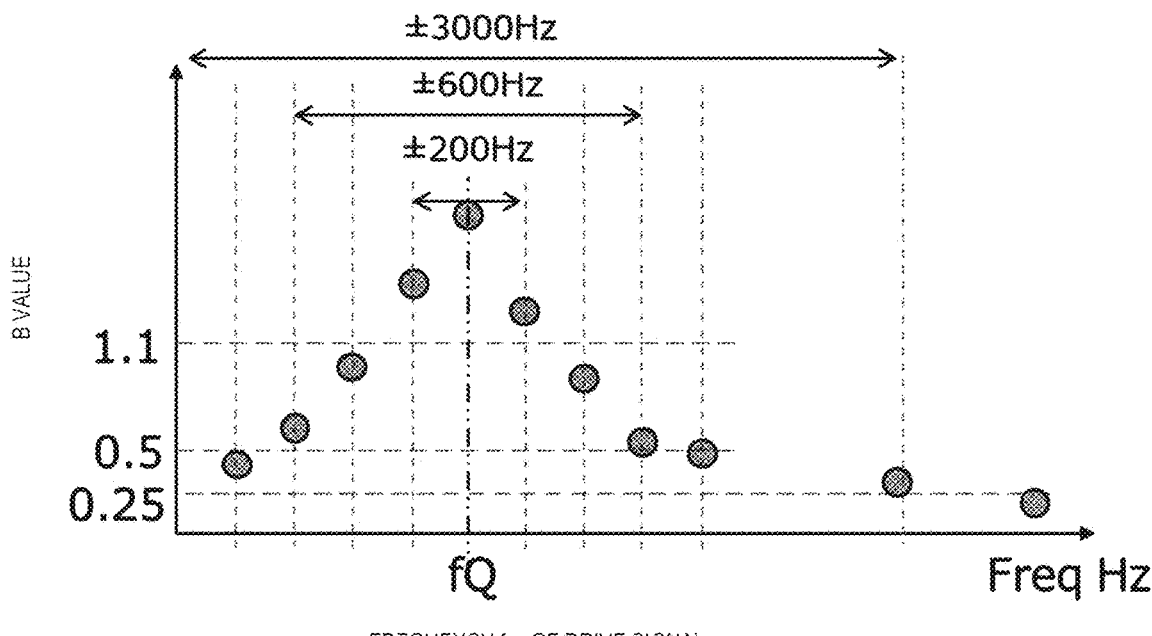
FIG. 15 is a conceptual diagram illustrating a relationship between the B value and a DC offset value of the drive signal, when the vibrator is excited by the signal generator.
FIG. 16 is a graph showing a relationship between a frequency of the drive signal and the B value when a quartz crystal resonator is excited by a function generator, where a resonance frequency of the quartz crystal resonator is $f_Q$ and the frequency of the drive signal is $f_{osc}$.

FIG. 15 is a conceptual diagram illustrating a relationship between the B value and a DC offset value of the drive signal, when the vibrator is excited by the signal generator.

When a DC offset is set, one of the surfaces is always at the ground potential. Therefore, it is considered that the change amplitude of the phase $\psi_m$ is smaller and the B value is relatively small compared to when the DC offset is not set.

When the DC offset is not set, that is, when the DC offset value is zero, the voltage value fluctuates with the voltage zero therebetween. In this case, one of both surfaces of the quartz crystal resonator chip is at a ground potential, and a positive or negative potential is applied to the other surface. Therefore, the quartz crystal resonator chip moves close to the vibration by thickness sliding. Therefore, it is considered that the change amplitude of the phase $\psi_m$ is larger and the B value is relatively larger than when the DC offset is set.

When an oscillation circuit is used instead of the function generator, it is possible to simultaneously apply potentials with alternating polarities to both sides of the quartz crystal resonator chip. In this case, since the quartz crystal resonator chip vibrates by thickness sliding, it is considered that a particularly large B value can be obtained.

As described above, the drive signal S1 preferably has a DC offset (DC component) of zero. By driving the vibrator 30 with such a drive signal, the B value can be increased. As a result, a signal noise ratio (S/N ratio) of the modulated signal can be increased. Thereby, robustness can be enhanced, and for example, it is possible to suppress a decrease in measurement accuracy due to fluctuations in the installation alignment of the laser interferometer 1.

FIG. 16 is a graph showing a relationship between a frequency $f_{osc}$ of the drive signal and the B value when a quartz crystal resonator is excited by a function generator, where a resonance frequency of the quartz crystal resonator is $f_Q$ and the frequency of the drive signal is $f_{osc}$.

FIG. 16 shows how the B value estimated from the light reception signal changes when the frequency $f_{osc}$ of the drive signal by the function generator is changed in units of 200 Hz. The drive signal from the function generator is a 3V rectangular wave, and the DC offset value is zero. Further, FIG. 16 also shows the absolute value of the difference between $f_{osc}$ and $f_Q$.

As is clear from FIG. 16, when $f_{osc}$ is changed, the B value becomes maximum when $f_{osc}=f_Q$. Then, the farther the $f_{osc}$ is from $f_Q$, the smaller the B value. Therefore, if $f_{osc}$ includes $f_Q$ and is in a range close to $f_Q$, a large B value can be maintained and high demodulation accuracy can be achieved.

Specifically, when $\Delta f=|f_Q-f_{osc}|\leq 3000$ Hz is satisfied, B≥0.265, which can achieve a displacement measurement accuracy of 1 nm when the number of sampling bits of the ADC is 11 bits or more, is satisfied.

Further, when $\Delta f=|f_Q-f_{osc}|\leq 600$ Hz is satisfied, B≥0.5, which can achieve a displacement measurement accuracy of 1 nm when the number of sampling bits of the ADC is 8 bits or more, is satisfied. The 8-bit sampling bit number is common as an ADC. Therefore, if Δf is within the above range, it contributes to cost reduction of the laser interferometer 1 while increasing the S/N ratio of the modulated signal.

Further, when $\Delta f=|f_Q-f_{osc}|\leq 200$ Hz is satisfied, B>π/3, which can more stably achieve a displacement measurement accuracy of 1 nm when the number of sampling bits of the ADC is 8 bits or more, is satisfied. The 8-bit sampling bit number is common as an ADC. Therefore, if Δf is within the above range, it contributes to cost reduction of the laser interferometer 1 while increasing the S/N ratio of the modulated signal. Further, since the robustness can be enhanced, it is possible to realize the laser interferometer 1 capable of stably performing highly accurate measurement.

As described above, when the resonance frequency of the quartz crystal resonator is $f_Q$ and the frequency of the drive signal is $f_{osc}$, it is preferable to satisfy at least $\Delta f=|f_Q-f_{osc}|\leq 3000$ Hz.

Thereby, the B value, which is the change amplitude of the phase $\psi_m$, can be made relatively large. Therefore, the demodulation accuracy in the demodulation circuit can be improved.

Although the laser interferometer according to the present disclosure has been described above based on the illustrated embodiment, the laser interferometer according to the present disclosure is not limited to the above-described embodiment, and the configuration of each section can be replaced with any configuration having the same function. Further, any other component may be added to the laser interferometer according to the embodiment.

What is claimed is:

1. A laser interferometer comprising:
a light source that emits first laser light;
an optical modulator that includes a vibrator and modulates the first laser light by using the vibrator to generate second laser light including a modulated signal;
a photodetector that receives interference light between third laser light including a sample signal generated by reflecting the first laser light on an object and the second laser light to output a light reception signal;
a demodulation circuit that demodulates the sample signal from the light reception signal based on a reference signal; and
a signal generator that outputs the reference signal input to the demodulation circuit and outputs a drive signal input to the optical modulator, wherein
Vd/Vr<10, where Vr is a voltage of the reference signal and Vd is a voltage of the drive signal,
the vibrator has a crystal AT resonator, and the crystal AT resonator is configured to vibrate by thickness sliding along a vibration direction,
a diffraction grating is formed on a surface of the crystal AT resonator, and the diffraction grating is configured with a plurality of grooves,
the second laser light is formed by modulating the first laser light at the plurality of grooves, and
an extending direction of each of the plurality of grooves is perpendicular to the vibration direction.

2. The laser interferometer according to claim 1, wherein Vd/Vr<2.

3. The laser interferometer according to claim 1, wherein $|f_Q-f_{osc}|\leq 3000$ [Hz], where $f_Q$ is a resonance frequency of the crystal AT resonator and $f_{osc}$ is a frequency of the drive signal.

4. The laser interferometer according to claim 1, wherein the drive signal has a DC component of zero.

5. The laser interferometer according to claim 1, wherein the light source includes a semiconductor laser element.

6. The laser interferometer according to claim 2, wherein the light source includes a semiconductor laser element.

7. The laser interferometer according to claim 1, wherein the light source includes a semiconductor laser element, and
the semiconductor laser element is one of a distributed feedback-laser diode, a laser diode with fiber bragg grating, or a vertical cavity surface emitting laser, and
the first laser light has a line width having coherence corresponding to a MHz band or less.

8. The laser interferometer according to claim 3, wherein the light source includes a semiconductor laser element.

9. The laser interferometer according to claim 4, wherein the light source includes a semiconductor laser element.

10. The laser interferometer according to claim 1, wherein the demodulation circuit demodulates a phase signal or a frequency signal as the sample signal.

11. The laser interferometer according to claim 2, wherein the demodulation circuit demodulates a phase signal or a frequency signal as the sample signal.

12. The laser interferometer according to claim 1, wherein the demodulation circuit demodulates a phase signal or a frequency signal as the sample signal to obtain displacement information of the object or velocity information of the object, respectively.

13. The laser interferometer according to claim 3, wherein the demodulation circuit demodulates a phase signal or a frequency signal as the sample signal.

14. The laser interferometer according to claim 4, wherein the demodulation circuit demodulates a phase signal or a frequency signal as the sample signal.

15. The laser interferometer according to claim 5, wherein the demodulation circuit demodulates a phase signal or a frequency signal as the sample signal.

16. The laser interferometer according to claim 6, wherein the demodulation circuit demodulates a phase signal or a frequency signal as the sample signal.

17. The laser interferometer according to claim 7, wherein the demodulation circuit demodulates a phase signal or a frequency signal as the sample signal.

18. The laser interferometer according to claim 8, wherein the demodulation circuit demodulates a phase signal or a frequency signal as the sample signal.

19. The laser interferometer according to claim 9, wherein the demodulation circuit demodulates a phase signal or a frequency signal as the sample signal.

* * * * *